United States Patent
Hoepfner

(10) Patent No.: US 9,272,371 B2
(45) Date of Patent: Mar. 1, 2016

(54) SOLDER JOINT FOR AN ELECTRICAL CONDUCTOR AND A WINDOW PANE INCLUDING SAME

(71) Applicants: AGC Automotive Americas R&D, Inc., Ypsilanti, MI (US); AGC Flat Glass North America, Inc., Alpharetta, GA (US)

(72) Inventor: Timothy P. Hoepfner, Grand Ledge, MI (US)

(73) Assignees: AGC AUTOMOTIVE AMERICAS R&D, INC., Ypsilanti, MI (US); AGC FLAT GLASS NORTH AMERICA, INC., Alpharetta, GA (US)

( * ) Notice: Subject to any disclaimer, the term of this patent is extended or adjusted under 35 U.S.C. 154(b) by 47 days.

(21) Appl. No.: 13/905,979

(22) Filed: May 30, 2013

(65) Prior Publication Data

US 2014/0353015 A1 Dec. 4, 2014

(51) Int. Cl.
*H05K 1/18* (2006.01)
*B23K 35/24* (2006.01)
(Continued)

(52) U.S. Cl.
CPC .............. *B23K 35/24* (2013.01); *B23K 35/26* (2013.01); *B23K 35/262* (2013.01); *B23K 35/264* (2013.01); *H05B 3/84* (2013.01); *H05K 1/181* (2013.01); *H05B 2203/016* (2013.01); *H05K 2201/1031* (2013.01); *H05K 2203/05* (2013.01)

(58) Field of Classification Search
CPC ...... H01R 4/023; B23K 35/24; B23K 35/264; B23K 35/262; B23K 35/26; H05K 1/18; H05K 1/181; H05K 2201/1031; H05K 2203/04

USPC .......... 174/250–268; 361/760; 420/561, 577, 420/589; 228/179.1–180.22, 225–226, 228/245–262; 428/673, 642; 439/83
See application file for complete search history.

(56) References Cited

U.S. PATENT DOCUMENTS

| 2,644,066 A | 6/1953 | Glynn |
| 2,709,211 A | 4/1955 | Glynn |
| 3,324,543 A | 6/1967 | McVey et al. |

(Continued)

FOREIGN PATENT DOCUMENTS

| CA | 2 835 381 A1 | 11/2012 |
| DE | 3604437 A1 | 8/1987 |

(Continued)

OTHER PUBLICATIONS

English language abstract and translation for DE 19536181 extracted from espacenet.com database on Oct. 8, 2013, 6 pages.

(Continued)

*Primary Examiner* — Ishwarbhai B Patel
(74) *Attorney, Agent, or Firm* — Howard & Howard Attorneys PLLC

(57) ABSTRACT

A solder joint is disposed on an electrical conductor which comprises silver. The solder joint comprises bismuth and tin. The solder joint has a microstructure comprising a bismuth-rich solder bulk and a silver-solder reaction zone. The bismuth-rich solder bulk is disposed adjacent to the silver-solder reaction zone. The solder joint comprises a plurality of bismuth-rich grains formed from bismuth and substantially dispersed throughout at least the bismuth-rich solder bulk of the solder joint. A window pane comprising the solder joint is also disclosed.

30 Claims, 8 Drawing Sheets

(51) Int. Cl.
*B23K 35/26* (2006.01)
*H05B 3/84* (2006.01)

(56) References Cited

U.S. PATENT DOCUMENTS

| | | |
|---|---|---|
| 3,390,969 A | 7/1968 | Sullivan et al. |
| 3,568,012 A | 3/1971 | Ernst |
| 3,607,176 A | 9/1971 | Milochevitch et al. |
| 3,657,802 A | 4/1972 | Delmas |
| 3,736,649 A | 6/1973 | Bristow |
| 3,789,192 A | 1/1974 | Spindler |
| 3,795,041 A | 3/1974 | Hennicke et al. |
| 3,900,593 A | 8/1975 | Herczog et al. |
| 3,926,357 A | 12/1975 | Matrisian |
| 4,024,613 A | 5/1977 | Martel et al. |
| 4,531,044 A | 7/1985 | Chang |
| 4,546,409 A | 10/1985 | Yoshino et al. |
| 4,589,584 A | 5/1986 | Christiansen et al. |
| 4,707,591 A | 11/1987 | Sprenger |
| 4,763,828 A | 8/1988 | Fukaya et al. |
| 4,769,622 A | 9/1988 | Leavitt |
| 4,782,209 A | 11/1988 | Caers et al. |
| 4,918,288 A | 4/1990 | Carter et al. |
| 4,925,421 A | 5/1990 | van den Broek |
| 4,925,607 A | 5/1990 | Kyle |
| 4,935,583 A | 6/1990 | Kyle |
| 5,013,612 A | 5/1991 | Hunt et al. |
| 5,058,800 A | 10/1991 | Yoshizawa et al. |
| 5,134,248 A | 7/1992 | Kiec et al. |
| 5,198,056 A | 3/1993 | Stockli et al. |
| 5,229,070 A * | 7/1993 | Melton et al. .......... 420/557 |
| 5,229,613 A | 7/1993 | Pandelisev et al. |
| 5,270,517 A | 12/1993 | Finley |
| 5,288,006 A | 2/1994 | Otsuka et al. |
| 5,350,105 A | 9/1994 | Delalle et al. |
| 5,354,392 A | 10/1994 | Santo et al. |
| 5,368,814 A | 11/1994 | Gonya et al. |
| 5,415,944 A | 5/1995 | Kazem-Goudarzi et al. |
| 5,427,865 A | 6/1995 | Mullen, III et al. |
| 5,429,293 A | 7/1995 | Bradley, III et al. |
| 5,454,506 A | 10/1995 | Jordhamo et al. |
| 5,540,379 A | 7/1996 | Kazem-Goudarzi et al. |
| 5,543,601 A | 8/1996 | Bartrug et al. |
| 5,626,483 A | 5/1997 | Naitoh |
| 5,735,446 A | 4/1998 | White et al. |
| 5,738,270 A | 4/1998 | Malmgren |
| 5,738,554 A | 4/1998 | Borger et al. |
| 5,798,031 A | 8/1998 | Charlton et al. |
| 5,837,960 A | 11/1998 | Lewis et al. |
| 5,845,836 A | 12/1998 | White et al. |
| 5,857,259 A | 1/1999 | Johnston |
| 5,867,128 A | 2/1999 | Sauer |
| 5,881,944 A | 3/1999 | Edwards et al. |
| 5,897,964 A | 4/1999 | White et al. |
| 5,986,208 A | 11/1999 | Taylor et al. |
| 5,995,293 A | 11/1999 | Derkits, Jr. et al. |
| 6,039,238 A | 3/2000 | Panaghe |
| 6,039,616 A | 3/2000 | Pereira et al. |
| 6,042,932 A | 3/2000 | Ingles et al. |
| 6,103,034 A | 8/2000 | Fujiwara et al. |
| 6,103,998 A | 8/2000 | Kuno et al. |
| 6,103,999 A | 8/2000 | Nishio et al. |
| 6,123,588 A | 9/2000 | Johnston |
| 6,135,829 A | 10/2000 | Johnston |
| 6,217,373 B1 | 4/2001 | Johnston |
| 6,229,221 B1 | 5/2001 | Kloen et al. |
| 6,249,966 B1 | 6/2001 | Pereira et al. |
| 6,253,986 B1 | 7/2001 | Brofman et al. |
| 6,253,988 B1 | 7/2001 | Pereira |
| 6,307,515 B1 | 10/2001 | Sauer et al. |
| 6,319,461 B1 | 11/2001 | Domi et al. |
| 6,359,540 B1 | 3/2002 | Spiller et al. |
| 6,396,026 B2 | 5/2002 | Gillner et al. |
| 6,428,367 B1 | 8/2002 | Costa |
| 6,475,043 B2 | 11/2002 | Pereira et al. |
| 6,528,769 B2 | 3/2003 | Schnabel et al. |
| 6,534,720 B2 | 3/2003 | Von Alpen et al. |
| 6,599,156 B2 | 7/2003 | Pereira et al. |
| 6,599,157 B2 | 7/2003 | Pereira et al. |
| 6,774,315 B1 | 8/2004 | Pierson et al. |
| 6,780,071 B2 | 8/2004 | Pereira et al. |
| 6,816,385 B1 | 11/2004 | Alcoe |
| 6,834,969 B2 | 12/2004 | Bade et al. |
| 6,872,465 B2 | 3/2005 | Soga et al. |
| 6,893,799 B2 | 5/2005 | Danovitch et al. |
| 6,902,098 B2 | 6/2005 | Dautartas |
| 6,945,831 B2 | 9/2005 | Pereira et al. |
| 7,010,856 B2 | 3/2006 | Suda et al. |
| 7,083,481 B2 | 8/2006 | Pereira et al. |
| 7,134,201 B2 | 11/2006 | Ackerman et al. |
| 7,223,695 B2 | 5/2007 | Zhong et al. |
| 7,223,939 B2 | 5/2007 | Hoepfner et al. |
| 7,370,982 B2 | 5/2008 | Bauer et al. |
| 7,780,058 B2 | 8/2010 | Yao et al. |
| 7,833,070 B2 | 11/2010 | Lyon |
| 7,838,954 B2 | 11/2010 | Buchwalter et al. |
| 7,972,710 B2 | 7/2011 | Pereira |
| 8,077,100 B2 | 12/2011 | Baranski |
| 8,092,621 B2 | 1/2012 | Ho et al. |
| 8,109,782 B2 | 2/2012 | Ziegler et al. |
| 8,157,158 B2 | 4/2012 | Gruber et al. |
| 8,277,244 B2 | 10/2012 | Ziegler et al. |
| 8,299,401 B2 | 10/2012 | Sitterlet et al. |
| 2001/0030185 A1 | 10/2001 | Schnabel et al. |
| 2002/0004325 A1 | 1/2002 | Pereira et al. |
| 2002/0111081 A1 | 8/2002 | Machado |
| 2002/0187690 A1 | 12/2002 | Pereira et al. |
| 2003/0017756 A1 | 1/2003 | Pereira et al. |
| 2003/0121906 A1 | 7/2003 | Abbott et al. |
| 2003/0155467 A1 | 8/2003 | Petrenko |
| 2003/0203666 A1 | 10/2003 | Pereira et al. |
| 2004/0237302 A1 | 12/2004 | Antaya et al. |
| 2004/0248477 A1 | 12/2004 | Pereira et al. |
| 2005/0195488 A1 | 9/2005 | McCable et al. |
| 2005/0221538 A1 | 10/2005 | Suzuki et al. |
| 2005/0239348 A1 | 10/2005 | Pereira et al. |
| 2006/0056003 A1 | 3/2006 | Tonar et al. |
| 2006/0102610 A1 | 5/2006 | Hoepfner et al. |
| 2006/0228953 A1 | 10/2006 | Pereira et al. |
| 2006/0240265 A1 | 10/2006 | Cook et al. |
| 2007/0037004 A1 | 2/2007 | Pereira |
| 2007/0105412 A1* | 5/2007 | Hoepfner et al. ........... 439/83 |
| 2007/0117475 A1 | 5/2007 | Tu |
| 2007/0224842 A1 | 9/2007 | Hoepfner et al. |
| 2007/0231594 A1 | 10/2007 | Pereira |
| 2008/0175748 A1* | 7/2008 | Pereira ............ B23K 1/0008 420/555 |
| 2009/0077797 A1 | 3/2009 | Berghofer et al. |
| 2010/0035072 A1* | 2/2010 | Watanabe et al. ............ 428/457 |
| 2010/0326983 A1 | 12/2010 | Sitterlet et al. |
| 2011/0220704 A1 | 9/2011 | Liu et al. |
| 2011/0244252 A1 | 10/2011 | Loh |
| 2011/0268985 A1* | 11/2011 | Zhang ............ B23K 35/0244 428/615 |
| 2012/0273043 A1 | 11/2012 | Lochtefeld et al. |
| 2012/0298416 A1* | 11/2012 | Ziegler et al. ............ 174/75 R |
| 2012/0305311 A1 | 12/2012 | Jenrich |
| 2013/0043066 A1 | 2/2013 | Cholewa et al. |
| 2013/0121874 A1* | 5/2013 | Ueshima et al. ............ 420/577 |
| 2014/0199115 A1* | 7/2014 | de Avila Ribas ..... B23K 35/262 403/272 |

FOREIGN PATENT DOCUMENTS

| | | |
|---|---|---|
| DE | 195 36 131 C1 | 1/1997 |
| DE | 19536181 A1 | 4/1997 |
| EP | 0262699 A1 | 4/1988 |
| EP | 0248030 A1 | 8/1988 |
| EP | 0426303 A2 | 5/1991 |
| EP | 0581610 A1 | 2/1994 |
| EP | 0869531 A2 | 10/1998 |
| EP | 1488972 A1 | 12/2004 |
| EP | 1657964 A1 | 5/2006 |
| EP | 1493207 B1 | 2/2007 |

(56) References Cited

FOREIGN PATENT DOCUMENTS

| | | |
|---|---|---|
| EP | 1 942 703 A2 | 7/2008 |
| FR | 1104595 A | 11/1955 |
| GB | 1228451 A | 4/1971 |
| JP | S62172676 A | 7/1987 |
| JP | 05-329931 A | 12/1993 |
| JP | 2002-134254 A | 5/2002 |
| WO | WO 96/19913 A1 | 6/1996 |
| WO | WO 98/16943 A1 | 4/1998 |
| WO | WO 98/47200 A1 | 10/1998 |
| WO | WO 2004/068643 A1 | 8/2004 |
| WO | WO 2006/128203 A1 | 12/2006 |

OTHER PUBLICATIONS

English language abstract and translation for DE 3604437 extracted from espacenet.com database on Oct. 8, 2013, 14 pages.
English abstract not found for FR 1104595. However see English equivalent U.S. Pat. No. 2,709,211. Original document extracted from espacenet.com database on Jan. 31, 2014, 5 pages.
English language abstract and translation for JP 05-329931 extracted from PAJ database on Aug. 6, 2013, 57 pages.
English language abstract and translation for JP 2002-134254 extracted from PAJ database on Oct. 8, 2013, 25 pages.
English language bibliography for JP 61272676 extracted from Thomson Innovation database on Jan. 30, 2014, 6 pages.
"http://en.wikipedia.org/wiki/Thermal expansion coefficient,Jul. 20, 2006, 3 pages."
Author Unknown, "Welding of Titanium Alloys", www.key-to-metals.comprinted Jun. 23, 2004, pp. 1-4, Copyright 2000-2003 INI International. Distributionfor Step-Commerce AG, Spiegelhofstrasse 26, Zurich Switzerland.
http://en.wikipedia.org/wiki/Soda-Lime Glass, Jul. 20, 2006, 3 pages.
Publication entitled "Future of Heatable Automotive Glazing Conductive Pastes",reprinted from Screenprinting & Decorating—Stars of the 'Silver' ScreenAutomotive Glass; from International Glass Review, published in 2001—Issue 2,pp. 117-122, by Artur Bechtloff, Product Manager Conductive Pastes, dmc2,Glass Systems Division, of Gutleutstrasse 215, D-60039 Frankfurt, Germany.
Publication entitled "Tarnishing-resistant Lead-free Silver Paste for AutomotiveBacklights", www.glassfiles.com reprinted from Glass Processing Days, p. 18-21, Jun. 2001, by Roland Billing and Detlef Rehorek of Johnson Matthey Glass.
European Search Report for Application EP 08 25 0009 dates Feb. 4, 2009, 2 pages.
International Search Report for Application No. PCT/US2008/006729 dated Sep. 4, 2008, 4 pages.
"Thermal Expansion Coefficients at 20 C", http://hyperphysics.phy-astr.gsu.edu/HBASE/Tables/thexp.html, Nov. 4, 2009, 1 page.
Wikipedia, "Soda-Lime Glass", http://en.wikipedia.org/wiki/Soda-Lime_Glass, Jul. 20, 2006, pp. 1-3.
English language abstract for DE 195 36 131 extracted from espacenet.com database on Jul. 23, 2015, 2 pages.
International Search Report for Application No. PCT/US2014/040281 dated Mar. 5, 2015, 4 pages.

* cited by examiner

SOLDER JOINT FOR AN ELECTRICAL CONDUCTOR AND A WINDOW PANE INCLUDING SAME

FIELD OF THE DISCLOSURE

The present disclosure generally relates to a solder joint for an electrical conductor and, more specifically, to a solder joint including a particular microstructure and a window pane including the same.

DESCRIPTION OF THE RELATED ART

Electrical connectors are known in the art for use in and on vehicles. An electrical connector may be bonded to an electrical conductor such that the electrical connector is operatively connected to and in electrical communication with the electrical conductor. The electrical conductor, which generally includes silver, is typically operatively connected to a substrate that is formed from glass, such as a window pane (e.g. backlite or windshield) of a vehicle. The electrical conductor is commonly visible on the window pane of the vehicle and typically extends horizontally across the window pane and may be utilized as a defogger, a defroster, and/or an antenna.

Typically, a solder is used to bond the electrical connector and the electrical conductor. The solder may include metals and/or alloys formed from lead, tin, copper, silver, bismuth, and/or other metals. However, since glass typically has a lower coefficient of thermal expansion than that of the electrical connector, thermal expansion and contraction of the glass and/or electrical connector due to changes in temperature may impart mechanical stress on the solder between the electrical connector operatively connected to the glass and the electrical connector. The mechanical stress on the solder may result in failure of the bond formed by the solder between the electrical connector and the electrical conductor.

Conventional solder typically includes lead because lead is a deformable metal and typically lowers the solidus temperature of the conventional solder. Therefore, conventional solder typically minimizes the mechanical stress between the electrical connector and the electrical conductor due to the changes in temperature. However, alternatives to conventional solders based on lead are desirable.

One example of a lead-free solder includes indium. The indium typically lowers the solidus temperature of the lead-free solder. However, indium is generally considered an expensive metal. As such, the lead-free solder including indium may be difficult to commercialize due to costs.

Another example of a lead-free solder is a tin-rich solder. However, the tin-rich solder has a solidus temperature of greater than 200° C., which is 40 to 50° C. higher than that of the lead-rich solder. This higher solidus temperature of the tin-rich solder may result in an increase in mechanical stress between the electrical connector and the electrical conductor. In addition, the tin-rich solder reacts aggressively with silver, such as the silver of the electrical conductor, to form $Ag_3Sn$. While the formation of $Ag_3Sn$ typically results in a strong bond between the tin-rich solder and electrical conductor, too much $Ag_3Sn$ formation may result in failure of the bond between the electrical connector and the electrical conductor due to brittleness of $Ag_3Sn$ and delamination of the tin-rich solder from the electrical conductor. The addition of a reaction rate modifier to the tin-rich solder, such as lead and/or indium, may reduce the formation of $Ag_3Sn$, but such elements are undesirable for other reasons including those introduced above. However, for reasons stated above, lead and/or indium are typically not suitable in solder.

SUMMARY OF THE DISCLOSURE AND ADVANTAGES

The present disclosure provides a solder joint disposed on an electrical conductor which comprises silver. The solder joint comprises bismuth and tin. The solder joint has a microstructure comprising a bismuth-rich solder bulk and a silver-solder reaction zone. The bismuth-rich solder bulk is disposed adjacent to the silver-solder reaction zone. The solder joint comprises a plurality of bismuth-rich grains formed from bismuth and substantially dispersed throughout at least the bismuth-rich solder bulk of the solder joint.

The present disclosure further provides a window pane comprising a substrate formed from glass. The window pane further comprises the electrical conductor which is disposed across a region of the substrate. The window pane also comprises the solder joint which is disposed on the electrical conductor. The window pane yet further comprises an electrical connector disposed on the solder joint. The electrical connector is operatively connected to and in electrical communication with the electrical conductor through the solder joint.

The present disclosure also provides an electrical device comprising a first electrical conductor comprising silver. The electrical device further comprises the solder joint which is disposed on the first electrical conductor. The electrical device also comprises a second electrical conductor disposed on the solder joint with the second electrical conductor operatively connected to and in electrical communication with the first electrical conductor through the solder joint.

BRIEF DESCRIPTION OF THE DRAWINGS

Other advantages of the present disclosure will be readily appreciated, as the same becomes better understood by reference to the following detailed description when considered in connection with the accompanying drawings wherein.

DETAILED DESCRIPTION OF THE DISCLOSURE

Figure 1:
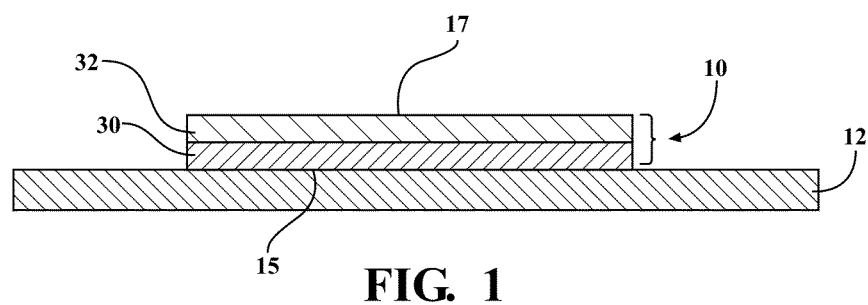
FIG. 1 is a cross-sectional schematic view of one embodiment of a solder joint disposed on an electrical conductor.

Referring to the Figures, wherein like numerals indicate like or corresponding parts throughout the several views, a solder joint is generally shown at 10 in FIG. 1. The solder joint 10, which will be described in further detail below, is disposed on an electrical conductor 12. The electrical conductor 12 comprises silver, however, it is to be appreciated the electrical conductor 12 may comprise other conductive metals and/or other conductive or nonconductive materials in addition to the silver. In certain embodiments, the electrical conductor 12 may have a face which comprises silver with the solder joint 10 bonded to the face of the electrical conductor 12. The electrical conductor 12 may be a film, a coating, and/or in any other form so long as the electrical conductor 12 is conductive and serves any function known in the art for electrical conductors, as described below. The electrical conductor 12 may be porous and/or nonporous. In various embodiments, the electrical conductor 12 is a porous silver film.

Figure 2:
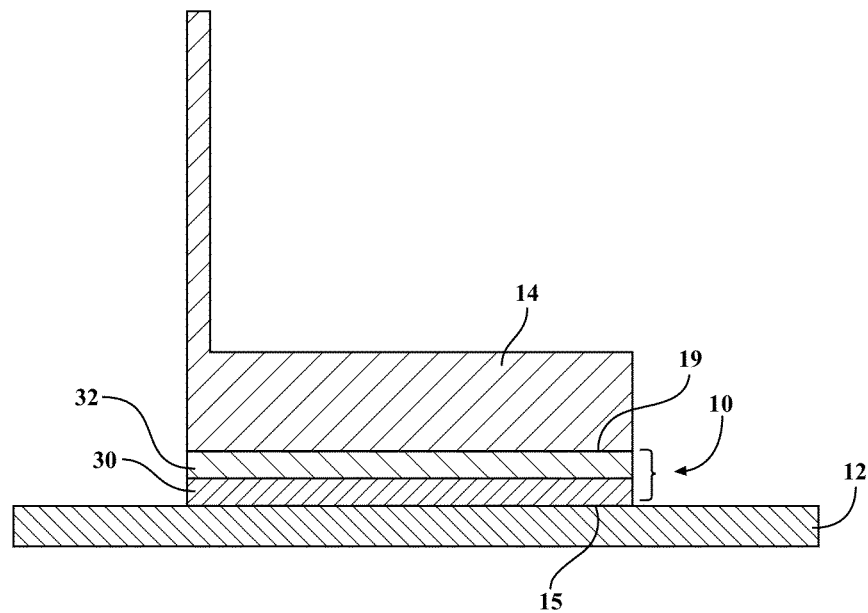
FIG. 2 is a cross-sectional schematic view of another embodiment of the solder joint with the solder joint disposed between the electrical conductor and an electrical connector.

As shown in FIG. 2, in various embodiments, an electrical connector 14 is disposed on the solder joint 10 with the electrical connector 14 operatively connected to and in electrical communication with the electrical conductor 12 through the solder joint 10. The electrical connector 14 may comprise copper, a copper alloy, silver, a silver alloy, or combinations thereof. The electrical connector 14 may also comprise other metals in addition to or absent the metals described above, including, but not limited to, iron, molybdenum, tungsten, nickel, hafnium, tantalum, titanium, chromium, iridium, niobium, vanadium, platinum, or combinations thereof. It is to be appreciated the electrical connector 14 may comprise other conductive metals and/or other conductive or nonconductive material. The electrical connector 14 may be in any form so long as the electrical connector 14 is conductive and serves any function known in the art for electrical connectors. In one embodiment, the electrical connector 14 comprises copper.

The solder joint 10 comprises bismuth and tin. Tin typically reacts with silver, such as a portion of the silver that is in the electrical conductor 12, to form a silver-tin alloy, such as $Ag_3Sn$. The formation of the silver-tin alloy results in a strong bond between the solder joint 10 and the electrical conductor 12. However, this reaction typically progresses quickly, which may result in the silver at the face of the electrical conductor 12 dissolving into the solder joint 10. This dissolving of the silver may result in poor solderability and delamination between the solder joint 10 and the electrical conductor 12. The bismuth in the solder joint 10 may partially function as a reaction rate modifier, thereby at least partially suppressing this aggressive reaction, which may result in improved solderability and minimized delamination.

In certain embodiments, the solder joint 10 and the electrical conductor 12 form a solder-conductor interface 15 therebetween. The solder joint 10 may have a surface 17 opposite the solder-conductor interface 15. A thickness of the solder joint 10 may extend from the solder-conductor interface 15 to the surface 17 of the solder joint 10. The solder-interface 15 may alternatively be referred to as the face of the electrical conductor 12.

In other embodiments comprising the electrical connector 14, the solder joint 10 and the electrical connector 14 form a solder-connector interface 19 therebetween. In these embodiments, the thickness of the solder joint 10 may extend from the solder-conductor interface 15 to the solder-connector interface 19 of the solder joint 10. It is to be appreciated that the solder-connector interface 19 is essentially the surface 17 in embodiments where the electrical connector 14 is present. The thickness of the solder joint 10 may be from $10 \times 10^{-6}$ to $500 \times 10^{-6}$, alternatively from $50 \times 10^{-6}$ to $250 \times 10^{-6}$, alternatively from $80 \times 10^{-6}$ to $120 \times 10^{-6}$, meters.

Figure 3:
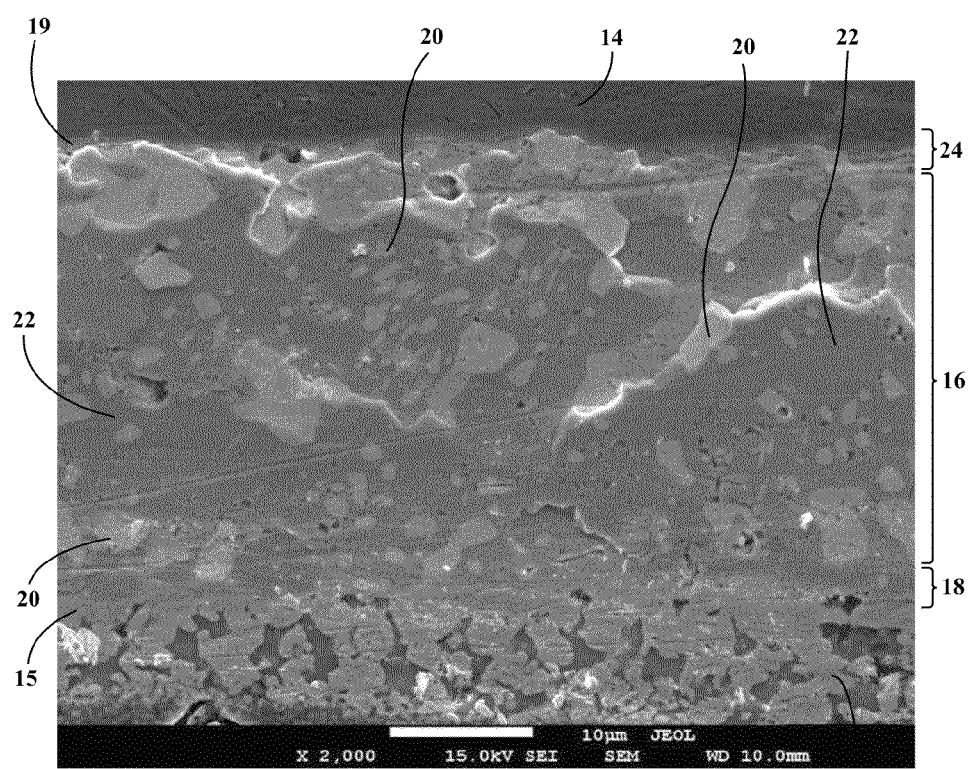
FIG. 3 is a cross-sectional view by scanning electron microscope (SEM) of a microstructure of one embodiment of the solder joint.
Figure 4:
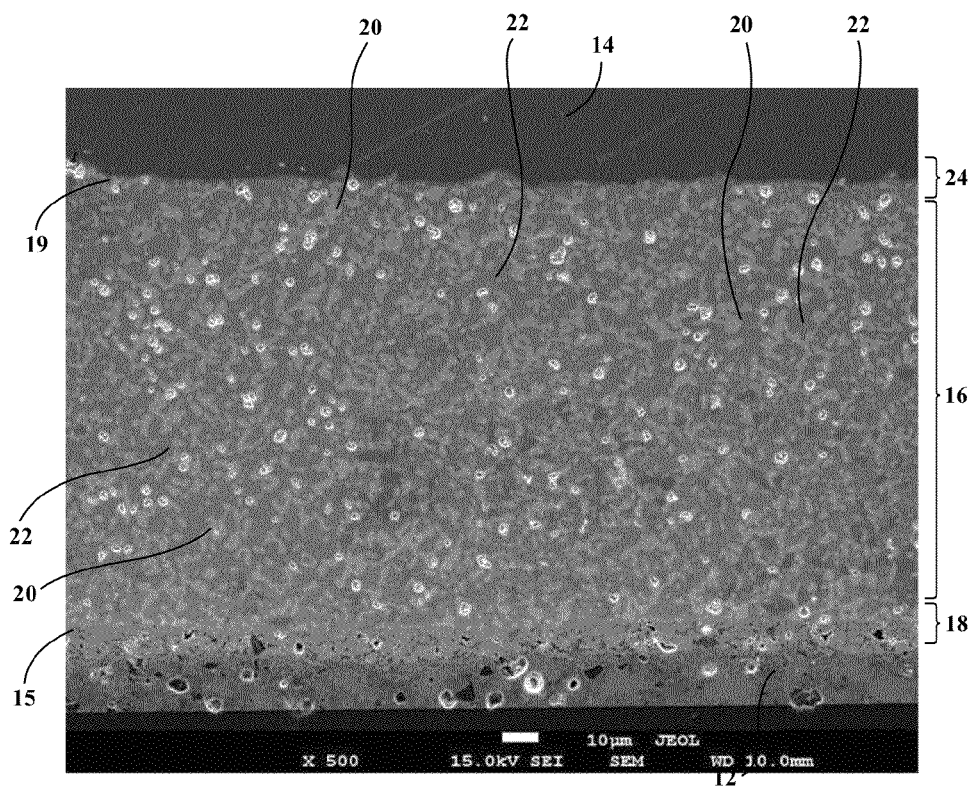
FIG. 4 is a cross-sectional view by SEM of a microstructure of another embodiment of the solder joint.
Figure 5:
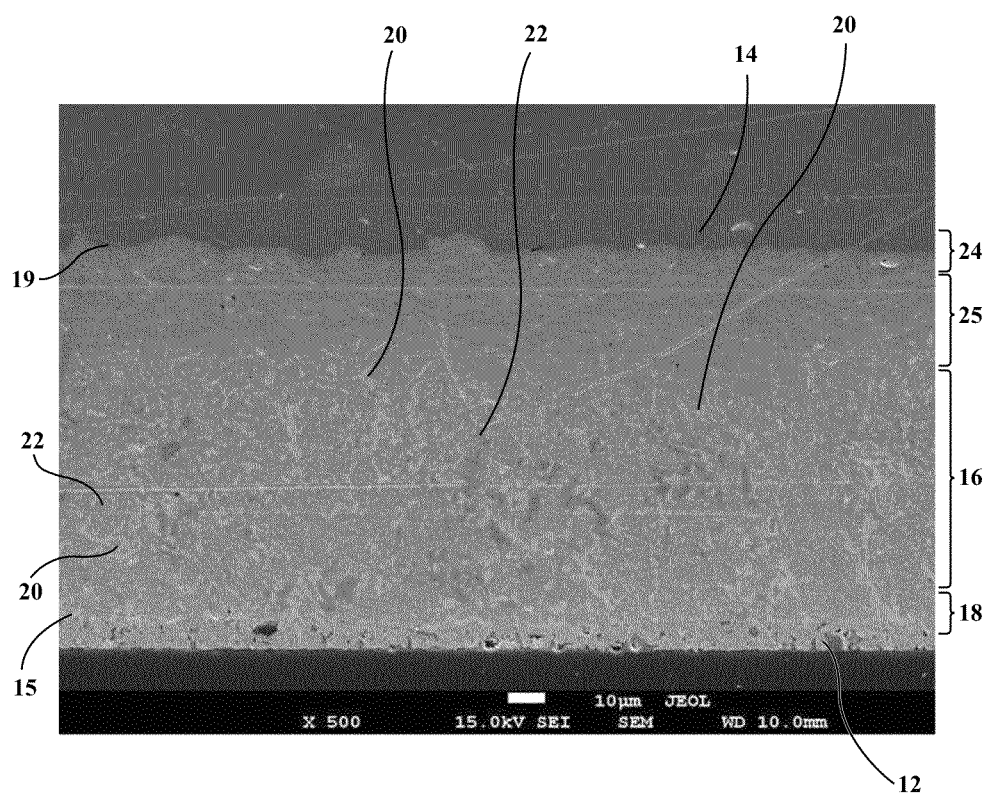
FIG. 5 is a cross-sectional view by SEM of a microstructure of another embodiment of the solder joint.

As shown in FIGS. 3, 4, and 5, the solder joint 10 has a microstructure which comprises a bismuth-rich solder bulk 16 and a silver-solder reaction zone 18. The bismuth-rich solder bulk may also be referred to in the art as a bismuth-rich phase or a bismuth-rich solder. The bismuth-rich solder bulk 16 may be formed from a portion of the bismuth and a portion of the tin in the solder joint 10.

The solder joint 10 comprises a plurality of bismuth-rich grains 20 formed from bismuth. The bismuth-rich grains 20 may also be referred to in the art as bismuth-rich crystals. The bismuth-rich grains 20 may be disposed within a tin-rich matrix 22. The bismuth-rich solder bulk 16 of the microstructure typically comprises the bismuth-rich grains 20 disposed within the tin-rich matrix 22. It is to be appreciated that a portion of the bismuth-rich grains 20 may not be limited to the bismuth-rich solder bulk 16. Said differently, the bismuth-rich grains 20 may be present in any portion of the microstructure in addition to the bismuth-rich solder bulk 16 of the solder joint 10, such as the silver-solder reaction zone 18.

Figure 6:
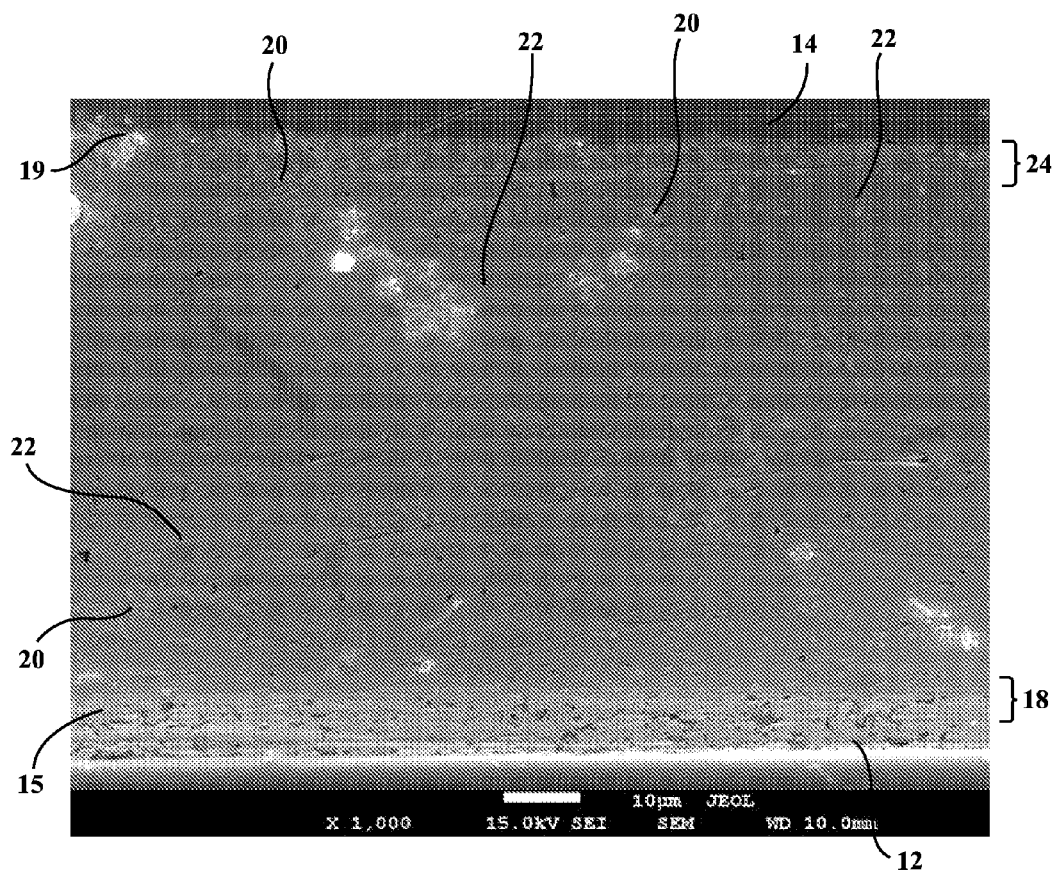
FIG. 6 is a cross-sectional view by SEM of a microstructure of a conventional solder joint.

The bismuth-rich grains 20 are substantially dispersed throughout at least the bismuth-rich solder bulk 16 of the solder joint 10. The terminology "substantially", as utilized herein with reference to the bismuth-rich grains 20 being substantially dispersed, refers to at least 80%, alternatively at least 90%, alternatively at least 95%, alternatively at least 99%, of the bismuth-rich grains 20 being dispersed throughout at least the bismuth-rich solder bulk 16 of the solder joint 10. The terminology "dispersed" refers to the bismuth-rich grains 20 in the solder joint 10, which are neighboring and adjacent to one another, having a distance therebetween of no greater than $\frac{1}{6}$, alternatively no greater than $\frac{1}{8}$, alternatively no greater than $\frac{1}{12}$, alternatively no greater than $\frac{1}{16}$, of the thickness of the solder joint 10. The terminology "neighboring" or "adjacent to", as utilized herein with reference to the bismuth-rich grains 20 which are neighboring and adjacent to one another, refers to any two bismuth-rich grains 20 spaced from each other wherein the linear distance therebetween is free of bismuth-rich grains 20. For example, referring specifically to FIGS. 3 and 4, the bismuth-rich grains 20 are substantially dispersed throughout the solder joint 10. As another example, referring specifically to FIG. 5, the bismuth-rich grains 20 are substantially dispersed throughout the bismuth-rich solder bulk 16 of the solder joint 10. In contrast, as shown in FIG. 6, a microstructure of a conventional solder joint comprises the bismuth-rich grains 20 which are not substantially dispersed throughout the conventional solder joint. Further, as shown in FIG. 6, the microstructure of the conventional solder joint comprises the bismuth-rich grains 20 which are aggregated towards each of the solder-conductor interface 15 and solder-connector interface 19. Typically, sufficient dispersion of the bismuth-rich grains 20 throughout at least the bismuth-rich solder bulk 16 minimizes aggregation of the bismuth-rich grains 20 at each of the solder-conductor interface 15 and solder-connector interface 19. When the bismuth-rich grains 20 are not substantially dispersed throughout the solder joint 10, such as in conventional solder joints, poor solderability and delamination between the solder joint 10 and the electrical conductor 12 may result.

Figure 7:
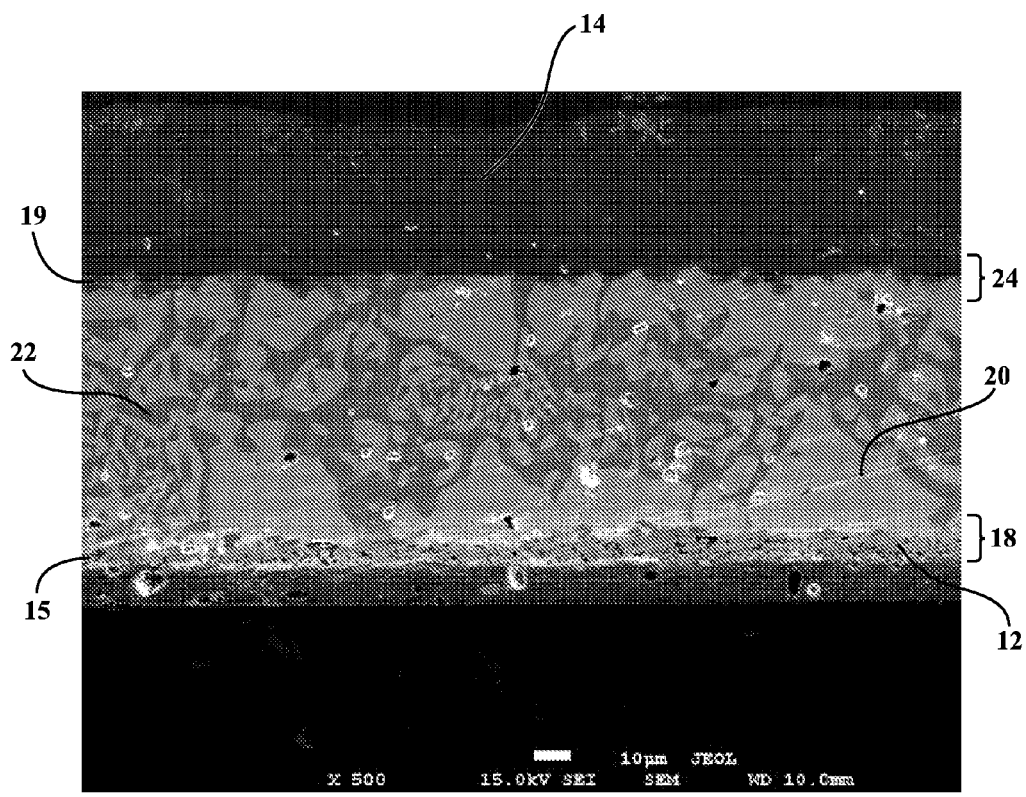
FIG. 7 is a cross-sectional view by SEM of a microstructure of another conventional solder joint.

Referring back to FIGS. 3, 4, and 5, in certain embodiments, each of the bismuth-rich grains 20 has a dimension of no greater than ¼, alternatively no greater than ⅙, alternatively no greater than ⅛, of the thickness of the solder joint 10. The terminology "dimension" refers to the length of a line extending within and/or outside each of the bismuth-rich grains 20 from a first point to a second point with the first point at a first outermost periphery of each of the bismuth-rich grains 20 and the second point at a second outermost periphery of each of the bismuth-rich grains 20 spaced from the first point. The length may also be referred to as an average largest dimension. As a non-limiting example, if one of the bismuth-rich grains 20 has a spherical-like configuration, the dimension of the bismuth-rich grain 20 may be defined as a diameter of the bismuth-rich grain 20. As a further non-limiting example, if one of the bismuth-rich grains 20 has a crescent-like configuration, the dimension of the bismuth-rich grain 20 may be defined as a length extending outside the bismuth-rich grain 20 between the points of the crescent shape of the bismuth-rich grain 20. In contrast, as shown in FIG. 7, a microstructure of a conventional solder joint comprises each of the bismuth-rich grains 20 having a dimension of greater than ¼ of the thickness of the conventional solder joint.

Each of the bismuth-rich grains 20 may have a grain boundary extending along an outermost periphery of each of the bismuth-rich grains 20. The grain boundaries are typically the weakest portion of a solder joint 10, especially when the solder joint 10 is under stress. At elevated temperatures, the bismuth-rich grains 20 may exhibit high atomic mobility at the grain boundaries which may further weaken bonding between neighboring bismuth-rich grains 20 and/or the tin-rich matrix 22. Therefore, the bismuth-rich grain 20 having a dimension of no greater than ¼ of the thickness of the solder joint 10 results in the bismuth-rich grain 20 having a reduced grain boundary in a solder joint 10. This reduced grain boundary of the bismuth-rich grain 20 typically provides a solder joint 10 which is resistant to failure at elevated heat and tensile loads. In addition, because the bismuth-rich grains 20 are substantially dispersed throughout at least the bismuth-rich solder bulk 16 of the solder joint 10 and have a dimension of no greater than ¼ of the thickness of the solder joint 10, the bismuth-rich grains 20 typically prevent grain boundary sliding during hot creep loading.

In various embodiments, the bismuth-rich grains 20 of the solder joint 10 are not substantially adjacent to the electrical connector 14. The terminology "substantially", as utilized herein with reference to the bismuth-rich grains 20 not being substantially adjacent to the electrical connector 14, refers to no greater than 10%, alternatively no greater than 5%, alternatively no greater than 1%, of the bismuth-rich grains 20 are adjacent to the electrical connector 14. The terminology "adjacent to", as utilized herein with reference to the bismuth-rich grains 20 not being substantially adjacent to the electrical connector 14, refers to the bismuth-rich grains 20 being in direct contact with (i.e. touching) the electrical connector 14. Typically, in embodiments when the electrical connector 14 comprises copper, interactions between the copper of the electrical connector 14 and the bismuth of the bismuth-rich grains 20 may result in embrittlement of the solder joint 10. As such, the bismuth-rich grains 20 being not substantially adjacent to the electrical connector 14 may reduce embrittlement of the solder joint 10.

The silver-solder reaction zone 18 of the solder joint 10 may be formed from a portion of the silver in the electrical conductor 12 and a portion of the tin in the solder joint 10. As described above, silver and tin may react to form a silver-tin alloy. As such, the silver-solder reaction zone 18 may comprise the silver-tin alloy formed from the reaction of a portion of the silver in the electrical conductor 12 and a portion of the tin in the solder joint 10.

The bismuth-rich solder bulk 16 is disposed adjacent to the silver-solder reaction zone 18. Typically, the silver-solder reaction zone 18 is disposed between the electrical conductor 12 and the bismuth-rich solder bulk 16. As described above, the bismuth in the solder joint 10 may partially function as the reaction rate modifier, thereby suppressing the formation of the silver-tin alloy. To this end, a portion of the bismuth and a portion of the tin in the solder joint 10 form the bismuth-rich solder bulk 16 to at least partially suppress formation of the silver-tin alloy. As such, a limited portion of the tin in the solder joint 10 may react with a portion of the silver in the electrical conductor 12 to form the silver-solder reaction zone 18 which comprises the silver-tin alloy. In addition, the silver-solder reaction zone 18 may comprise bismuth, such as the bismuth of the solder-conductor interface 15. The bismuth-rich solder bulk 16 disposed adjacent to the silver-solder reaction zone 18 may result in a strong bond between the solder joint 10 and the electrical conductor 12 while at least partially suppressing the aggressive reaction of tin and silver. As described above, this aggressive reaction may result in poor solderability and delamination between the solder joint 10 and the electrical conductor 12.

In various embodiments, the solder-conductor interface 15 of the solder joint 10 comprises the bismuth and the silver-solder reaction zone 18. The bismuth and the silver-tin alloy of the silver-solder reaction zone 18 typically cooperate to form a strong bond between the solder joint 10 and the electrical conductor 12 while minimizing delamination of the solder joint 10 from the electrical conductor 12. Said differently, the bismuth typically breaks up the continuous silver-tin alloy of the silver-solder reaction zone 18 to increase durability of the solder joint 10. The solder-conductor interface 15 of the solder joint 10 typically comprises bismuth in an amount at least similar to the amount of bismuth in the solder joint 10.

In certain embodiments, the bismuth of the solder joint 10 diffuses into the silver of the electrical conductor 12. This diffusion of the bismuth into the silver typically occurs at elevated temperatures, such as 400° C. In these embodiments, the bismuth typically diffuses into the silver in amounts of no greater than 12, alternatively no greater than 5, alternatively no greater than 1, part(s) by weight of the bismuth, each based on 100 parts by weight of the silver of the electrical conductor 12. Typically, the diffusion of bismuth into the silver of the electrical conductor 12 increases the thermal stability of the solder joint 10.

Referring back to FIGS. 3, 4, and 5, the microstructure of the solder joint 10 typically further comprises a copper-tin intermetallic phase 24. Tin typically reacts with copper, such as a portion of the copper that may be in the electrical connector 14, if present, to form a copper-tin alloy, such as $Cu_6Sn_5$. The copper-tin intermetallic phase 24 may be formed from a portion of the tin in the solder joint 10 and a portion of the copper that may be in the electrical connector 14. Referring specifically to FIGS. 3 and 4, in certain embodiments, the copper-tin intermetallic phase 24 is disposed between the bismuth-rich solder bulk 16 and the electrical connector 14.

Referring specifically to FIG. 5, in other embodiments, the microstructure of the solder joint 10 further comprises a tin-rich phase 25. The tin-rich phase typically comprises tin, but may comprise other metals and/or alloys in addition to tin.

The tin-rich phase 25 may be disposed adjacent to the bismuth-rich solder bulk 16 and opposite the silver-solder reaction zone 18. In these embodiments, the tin-rich phase 25 is disposed adjacent to the copper-tin intermetallic phase 24. The tin-rich phase 25 typically exhibits higher ductility than the bismuth-rich solder bulk 16 and may absorb thermal expansion stress from the electrical connector 14. In addition, the bismuth of the solder joint 10 is spaced apart from the copper of the electrical connector 14 by the tin-rich phase 25. As described above, interactions between copper and bismuth may result in embrittlement of the solder joint 10. As such, the tin-rich phase 25 typically increases durability of the solder joint 10 by reducing the embrittlement resulting from interactions between copper and bismuth and provides additional protection against thermal expansion stress.

In certain embodiments comprising the tin-rich phase 25, the bismuth-rich solder bulk 16 of the solder joint 10 extends at least ⅕, at least, alternatively at least ⅓, alternatively at least ½, alternatively at least ⅔, alternatively at least ⅘, of the thickness of the solder joint 10. In these embodiments, the bismuth-rich solder bulk 16 extends from the solder-conductor interface 15 to the tin-rich phase 25.

In various embodiments, such as embodiments free of the tin-rich phase 25, two or more distinct layers are generally not shown in the solder joint 10. Said differently, the solder joint 10 may be continuous in nature. However, in other embodiments, such as embodiments comprising the tin-rich phase 25, the solder joint shows more than one layer.

The solder joint 10 may comprise bismuth in an amount of from 1 to 65, alternatively from 5 to 60, alternatively from 7 to 55, alternatively from 20 to 30, part(s) by weight, each based on 100 parts by weight of the solder joint 10. The solder joint 10 may comprise tin in an amount of from 35 to 99, alternatively from 40 to 95, alternatively from 45 to 93, alternatively from 70 to 80, parts by weight, each based on 100 parts by weight of the solder joint 10.

In certain embodiments, the solder joint 10 further comprises other metals in addition to bismuth and tin such as, but not limited to, copper, silver, titanium, molybdenum, tungsten, nickel, hafnium, tantalum, chromium, iridium, indium, niobium, vanadium, platinum, lead, or combinations thereof.

In one embodiment, the solder joint 10 further comprises silver in addition to bismuth and tin. In this embodiment, the solder joint 10 may comprise silver in an amount of no greater than 10, alternatively no greater than 5, alternatively no greater than 3, parts by weight, each based on 100 parts by weight of the solder joint 10.

In this or other embodiments, the solder joint 10 further comprises copper in addition to bismuth and tin. In this embodiment, the solder joint 10 may comprise copper in an amount of no greater than 5, alternatively no greater than 3, alternatively no greater than 1, part(s) by weight, each based on 100 parts by weight of the solder joint 10.

In this or other embodiments, the solder joint 10 further comprises both silver and copper in addition to bismuth and tin. In these embodiments, the solder joint 10 may comprise silver in an amount of no greater than 10, alternatively no greater than 5, alternatively no greater than 3, parts by weight, each based on 100 parts by weight of the solder joint 10. Similarly, in these embodiments, the solder joint 10 may comprise copper in an amount of no greater than 5, alternatively no greater than 3, alternatively no greater than 1, part(s) by weight, each based on 100 parts by weight of the solder joint 10.

In this or other embodiments, the solder joint 10 is substantially free of indium. The terminology "substantially free" refers to the solder joint 10 comprising indium in an amount of less than 1, alternatively less than 0.1, alternatively less than 0.01, alternatively 0.0, part(s) by weight, each based on 100 parts by weight of the solder joint 10.

In this or other embodiments, the solder joint 10 is substantially free of lead. The terminology "substantially free" refers to the solder joint 10 comprising lead in an amount of less than 1, alternatively less than 0.1, alternatively less than 0.01, alternatively less than 0.001, alternatively 0.0, part(s) by weight, each based on 100 parts by weight of the solder joint 10.

In certain embodiments, the solder joint 10 is formed from a first solder composition and a second solder composition. However, it is to be appreciated that the solder joint 10 may be formed from any number of solder compositions, such as, 1, 3, 4, 5, 6, 7, 8, 9, etc., so long as the solder joint 10 formed therefrom has the microstructure described above.

In various embodiments, the first and the second solder compositions are utilized to form the solder joint 10. The first solder composition may be utilized having a thickness of from $10\times10^{-6}$ to $500\times10^{-6}$, alternatively from $50\times10^{-6}$ to $250\times10^{-6}$, alternatively from $80\times10^{-6}$ to $120\times10^{-6}$, meters. The second solder composition may be utilized having a thickness of from $10\times10^{-6}$ to $500\times10^{-6}$, alternatively from $50\times10^{-6}$ to $250\times10^{-6}$, alternatively from $80\times10^{-6}$ to $120\times10^{-6}$, meters. It is to be appreciated that the solder joint 10 formed from the first and second solder compositions may have a thickness different than the combination of the individual thicknesses of the first and second solder compositions. As a non-limiting example, if the first and second solder compositions each has a thickness of $10\times10^{-6}$ meters such that the combination of the thicknesses is $20\times10^{-6}$ meters, the solder joint 10 formed from these first and second solder compositions may have a thickness of less than $20\times10^{-6}$ meters. This difference in thickness may occur during formation of the solder joint 10, such as due to "squeeze-out", "wet-out", and/or other solder formation phenomena known in the art. Squeeze-out is typically due to the pressure employed during the formation of the solder joint 10. Wet-out is typically due to metals and/or alloys of the solder joint 10 which are adjacent to each other and having similar surface tensions such that one metal and/or alloy flows along another metal and/or alloy during formation of the solder joint 10.

The first and second solder compositions may have any density known in the art for solder compositions. Typically, the first solder composition has a density of from 8 to 9 $g/cm^3$ and the second solder composition has a density of from 7 to 7.5 $g/cm^3$. The first solder composition may have an area density of from 0.009 to 1.2, alternatively from 0.03 to 0.7, alternatively from 0.09 to 0.5, $g/cm^2$. The second solder composition may have an area density of from 0.007 to 1.0, alternatively from 0.025 to 0.75, alternatively from 0.07 to 0.4, $g/cm^2$.

In one embodiment, the first solder composition comprises bismuth. In this embodiment, the first solder composition may comprise bismuth in an amount of from 10 to 80, alternatively from 30 to 80, alternatively from 40 to 75, parts by weight, each based on 100 parts by weight of the first solder composition.

In another embodiment, the first solder composition further comprises tin in addition to the bismuth. In this embodiment, the first solder composition may comprise tin in an amount of from 20 to 90, alternatively from 20 to 70, alternatively from 25 to 60, parts by weight, each based on 100 parts by weight of the first solder composition.

In yet another embodiment, the first solder composition comprises bismuth, tin, and silver. In this embodiment, the first solder composition may comprise bismuth in an amount of from 10 to 80, alternatively from 30 to 80, alternatively from 40 to 75, parts by weight, each based on 100 parts by weight of the first solder composition. Similarly, in this embodiment, the first solder composition may comprise tin in an amount of from 20 to 90, alternatively from 20 to 70, alternatively from 25 to 60, parts by weight, each based on 100 parts by weight of the first solder composition. The first solder composition may comprise silver in an amount of no greater than 10, alternatively no greater than 5, alternatively no greater than 3, parts by weight, each based on 100 parts by weight of the first solder composition.

In still another embodiment, the first solder composition comprises bismuth, tin, and copper. In this embodiment, the first solder composition may comprise bismuth in an amount of from 10 to 80, alternatively from 30 to 80, alternatively from 40 to 75, parts by weight, each based on 100 parts by weight of the first solder composition. Similarly, in this embodiment, the first solder composition may comprise tin in an amount of from 20 to 90, alternatively from 20 to 70, alternatively from 25 to 60, parts by weight, each based on 100 parts by weight of the first solder composition. The first solder composition may comprise copper in an amount of no greater than 10, alternatively no greater than 7, alternatively no greater than 5, part(s) by weight, each based on 100 parts by weight of the first solder composition.

In another embodiment, the first solder composition comprises bismuth, tin, silver, and copper. In this embodiment, the first solder composition may comprise bismuth in an amount of from 10 to 80, alternatively from 30 to 80, alternatively from 40 to 75, parts by weight, each based on 100 parts by weight of the first solder composition. Similarly, in this embodiment, the first solder composition may comprise tin in an amount of from 20 to 90, alternatively from 20 to 70, alternatively from 25 to 60, parts by weight, each based on 100 parts by weight of the first solder composition. The first solder composition may comprise silver in an amount of no greater than 10, alternatively no greater than 5, alternatively no greater than 3, parts by weight, each based on 100 parts by weight of the first solder composition. The first solder composition may comprise copper in an amount of no greater than 10, alternatively no greater than 7, alternatively no greater than 5, part(s) by weight, each based on 100 parts by weight of the first solder composition.

The first solder composition may have a solidus temperature of from 138 to 185, alternatively from 138 to 150, alternatively from 138 to 140, ° C. This solidus temperature may reduce the temperature at which the solder joint 10 is formed, thereby reducing mechanical stress between the electrical conductor 12 and the electrical connector 14. The first solder composition comprising bismuth is typically a stiff solder and is commonly referred to in the art as a bismuth-rich solder.

Generally, temperatures at which a phase change of a solder occurs, such as when the phase change is from an intermediate phase to a solid phase, may be described as a solidus temperature. When the phase change is from the intermediate phase to a liquid phase, it may be described as a liquidus temperature. A eutectic alloy of the solder comprises certain proportions of metals which may result in the solidus temperature and the liquidus temperature being the same for the solder. Therefore, the eutectic alloy of the solder may have a melting point temperature that is the same as the solidus temperature and the liquidus temperature of the eutectic alloy of the solder. Conversely, a non-eutectic alloy of the solder comprises nearly all other proportions of metals which may result in the solder having a solidus temperature and a liquidus temperature that are different from one another. More specifically, as temperature increases, the non-eutectic alloy of the solder may begin to melt at the solidus temperature of the non-eutectic alloy and may completely melt at the liquidus temperature of the non-eutectic alloy. Therefore, the non-eutectic alloy of the solder may have a melting point temperature between the solidus temperature and the liquidus temperature of the non-eutectic alloy of the solder.

In one embodiment, the second solder composition comprises tin. In this embodiment, the second solder composition may comprise tin in an amount of from 95 to 100, alternatively from 95 to 98, alternatively from 96 to 97, parts by weight, each based on 100 parts by weight of the second solder composition.

In another embodiment, the second solder composition comprises tin and silver. In this embodiment, the second solder composition may comprise tin in an amount of from 95 to 100, alternatively from 95 to 98, alternatively from 96 to 97, parts by weight, each based on 100 parts by weight of the second solder composition. Similarly, in this embodiment, the second solder composition may comprise silver in an amount of no greater than 5, alternatively no greater than 4, alternatively no greater than 3, parts by weight, each based on 100 parts by weight of the second solder composition.

In yet another embodiment, the second solder composition comprises tin and copper. In this embodiment, the second solder composition may comprise tin in an amount of from 95 to 100, alternatively from 95 to 98, alternatively from 96 to 97, parts by weight, each based on 100 parts by weight of the second solder composition. Similarly, in this embodiment, the second solder composition may comprise copper in an amount of no greater than 2 parts, alternatively no greater than 1, alternatively no greater than 0.5, part(s) by weight, each based on 100 parts by weight of the second solder composition.

In still another embodiment, the second solder composition comprises tin, silver, and copper. The silver and copper in the second solder composition typically control the formation of the copper-tin intermetallic phase which comprises the copper tin alloy ($Cu_6Sn_5$) in the solder-connector interface 19. In this embodiment, the second solder composition may comprise tin in an amount of from 95 to 100, alternatively from 95 to 98, alternatively from 96 to 97, parts by weight, each based on 100 parts by weight of the second solder composition. Similarly, in this embodiment, the second solder composition may comprise silver in an amount of no greater than 5, alternatively no greater than 4, alternatively no greater than 3, parts by weight, each based on 100 parts by weight of the second solder composition. The second solder composition may comprise copper in an amount of no greater than 2, alternatively no greater than 1, alternatively no greater than 0.5, part(s) by weight, each based on 100 parts by weight of the second solder composition.

The second solder composition may have a solidus temperature of from 212 to 232, alternatively from 215 to 224, alternatively from 217 to 221, ° C. The second solder composition comprising tin is typically a soft solder. The second solder composition comprising tin is commonly referred to in the art as a tin-rich solder.

Figure 8:
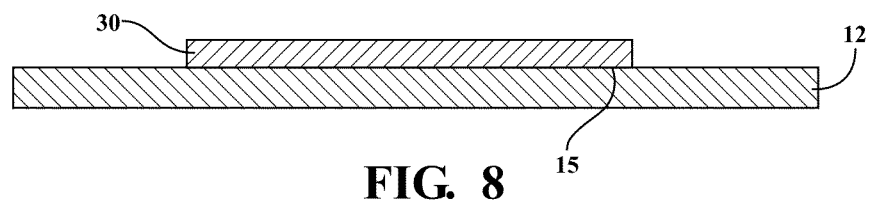
FIG. 8 is a cross-sectional schematic view of one embodiment of a first solder layer disposed on the electrical conductor.

As shown in FIG. 8, in certain embodiments, the solder joint 10 is formed by the step of bonding the first solder composition to the electrical conductor 12 to form a first solder layer 30. The first solder composition may be bonded to the electrical conductor 12 by any method known in the art, such as, hot air soldering, hot metal, inductive heating, thermal spray, plasma spray, friction bonding, and/or ultrasonic bonding.

In these embodiments, the solder joint 10, as shown in FIG. 1, is formed by the step of bonding the second solder composition to the first solder layer 30, thereby forming the solder joint 10. It is to be appreciated that bonding of the second solder composition to the first solder layer 30 may form a second solder layer 32, thereby forming the solder joint 10. The second solder composition may be bonded to the first solder layer 30 by any method known in the art, such as, hot air soldering, hot metal, resistance soldering, inductive heating, thermal spray, and/or ultrasonic bonding. The first solder composition and second solder composition may be bonded and/or applied via independently chosen methods.

Figure 9:
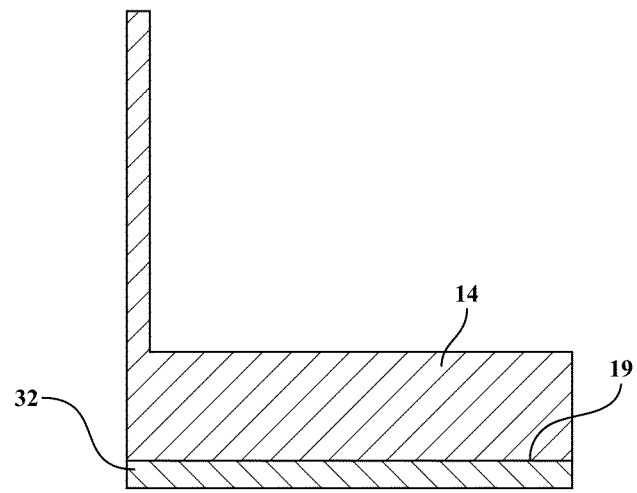
FIG. 9 is a cross-sectional schematic view of one embodiment of a second solder layer disposed on the electrical connector.

In other embodiments, as shown in FIGS. 8 and 9, when the electrical connector 14 is present, the solder joint 10 is formed by the step of bonding the first solder composition to the electrical conductor 12 to form the first solder layer 30. The first solder composition may be bonded to the electrical conductor 12 by any method known in the art, such as, hot air soldering, hot metal, inductive heating, thermal spray, plasma spray, friction bonding, and/or ultrasonic bonding.

In these embodiments, the solder joint 10 is formed by the step of bonding the second solder composition to the electrical connector 14 to form the second solder layer 32. The second solder composition may be bonded to the electrical connector 14 by any method known in the art, such as, reflow, stamping, and/or dipping.

In these embodiments, the solder joint 10, as shown in FIG. 2, is formed by the step of bonding the first solder layer 30 and the second solder layer 32 together to form the solder joint 10. The first solder layer 30 and the second solder layer 32 may be bonded together by any method known in the art, such as, hot iron soldering, resistive soldering, hot air soldering, friction bonding, ultrasonic bonding, thermal compression bonding, and/or laser assisted bonding.

In various embodiments, when the electrical connector 14 is present, the solder joint 10 is formed by the step of bonding the first solder composition to the electrical conductor 12 to form the first solder layer 30. The first solder composition may be bonded to the electrical conductor 12 by any method known in the art, such as, hot air soldering, hot metal, inductive heating, thermal spray, plasma spray, friction bonding, and/or ultrasonic bonding.

In these embodiments, the solder joint 10 is formed by the step of bonding the second solder composition to the first solder layer 30 to form a second solder layer 32. The second solder composition may be bonded to the first solder layer 30 by any method known in the art, such as, hot air soldering, hot metal, resistance soldering, inductive heating, thermal spray, and/or ultrasonic bonding. The first solder composition and second solder composition may be bonded and/or applied via independently chosen methods.

In these embodiments, the solder joint 10 is formed by the step of bonding the electrical connector 14 to the second solder layer 32. The electrical connector 14 may be bonded to the second solder layer 32 by any method known in the art, such as, hot iron soldering, resistive soldering, hot air soldering, friction bonding, ultrasonic bonding, thermal compression bonding, and/or laser assisted bonding.

It is to be appreciated that at least one of the steps of bonding described above may inherently comprise the step of cooling the first solder composition, the second solder composition, and/or the first and second solder layers 30, 32 to below the solidus temperature of the first solder composition, the second solder composition, and/or the first and second solder layers 30, 32, respectively. In certain embodiments, at least one of the steps of bonding described above may comprise the step of cooling subsequent to at least one of the steps of bonding. The step of cooling may be accomplished by any method known in the art for cooling solder, such as by ambient air, forced air, and/or cooled air.

In certain embodiments, the first solder composition is the bismuth-rich solder and the second solder composition is the tin-rich solder. In these certain embodiments, the formation of the first solder layer 30 from the bonding of the bismuth-rich solder to the electrical conductor 12, may result in the microstructure of the solder joint 10, as shown in FIGS. 3, 4, and 5. After the bonding of the tin-rich solder, or the second solder layer 32 formed from the tin-rich solder and the electrical connector 14, the bismuth-rich solder bulk 16 may partially function as a barrier, thereby at least partially suppressing the aggressive reaction of the tin of the solder joint 10 and the silver of the electrical conductor 12.

In contrast to the microstructure of the inventive solder joint 10, a microstructure of a conventional solder joint, as shown in FIG. 6, may be formed by any conventional method. The conventional solder joint is formed by the step of bonding the first solder composition, the second solder composition, the electrical conductor, and electrical connector together, in one step, with the first solder composition bonded to the electrical conductor and the second solder composition and the second solder bonded to the first solder composition and the electrical connector.

It is to be appreciated that the solder joint 10 may be formed by any method and in any order known in the art so long as the solder joint 10 has the microstructure described above. The solder composition(s) and/or solder layer(s) may be bonded by any method, such as, hot air soldering, resistance soldering, hot metal, inductive heating, thermal spray, plasma spray, friction bonding, ultrasonic bonding, reflow, stamping, dipping, hot melt soldering, friction bonding, ultrasonic bonding, thermal compression bonding, and/or laser assisted bonding.

In various embodiments, the first and the second solder layers 30, 32 each has a thickness which contribute to the thickness of the solder joint 10. The thickness of the first solder layer 30 may be from $10 \times 10^{-6}$ to $500 \times 10^{-6}$, alternatively from $50 \times 10^{-6}$ to $250 \times 10^{-6}$, alternatively from $80 \times 10^{-6}$ to $120 \times 10^{-6}$, meters. The thickness of the second solder layer 32 may be from $10 \times 10^{-6}$ to $500 \times 10^{-6}$, alternatively from $50 \times 10^{-6}$ to $250 \times 10^{-6}$, alternatively from $80 \times 10^{-6}$ to $120 \times 10^{-6}$, meters.

Figure 10:
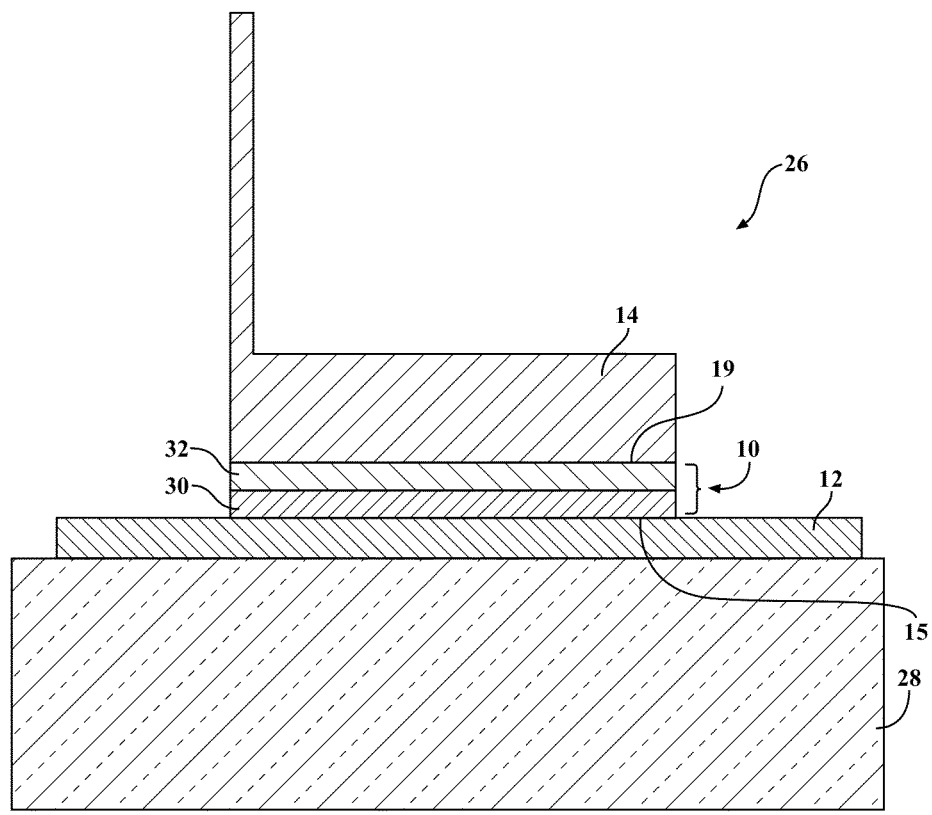
FIG. 10 is a cross-sectional schematic view of one embodiment of a window pane comprising the electrical conductor, the solder joint, and the electrical connector.

The solder joint 10 and electrical conductor 12 may be used in any application, such as for a window pane 26, as shown in FIG. 10. In certain embodiments, the window pane 26 is for a vehicle. The window pane 26 comprises a substrate 28 which is formed from glass. Typically, the glass is further defined as automotive glass. The glass may also be further defined as soda-lime-silica glass. However, it is to be appreciated that the glass may be any type of glass composition that is known in the art, e.g. borosilicate glass.

The window pane 26 may further comprise the electrical conductor 12. In certain embodiments, the electrical conductor 12 may be disposed across a region of the substrate 28. In other embodiments, a ceramic frit is disposed across a region of the substrate 28 with the electrical conductor 12 disposed across a region of the ceramic frit. The electrical conductor 12 may be visible on the window pane 26 and typically comprises lines that extend horizontally across the window pane 26. In these embodiments, the electrical conductor 12 may be utilized as, for example, a defogger, a defroster, and/or an antenna. However, it is to be appreciated that the electrical conductor 12 may serve any function known in the art for such electrical conductors 12.

The window pane 26 may also comprise the solder joint 10. As described above, the solder joint 10 comprises bismuth and tin and is disposed on the electrical conductor 12. The window pane 26 may further comprise the electrical connector 14. As described above, the electrical connector 14 may be disposed on the solder joint 10 with the electrical connector 14 operatively connected to and in electrical communication with the electrical conductor 12 through the solder joint 10.

In certain embodiments, the window pane 26 comprises the substrate formed from glass and the electrical conductor 12 comprising silver disposed across a region of the substrate. The window pane 26 further comprises the solder joint 10 comprising bismuth and tin and disposed on the electrical conductor 12 with the solder joint 10 having a microstructure comprising a bismuth-rich solder bulk 16 and a silver-solder reaction zone 18 with the bismuth-rich solder bulk 16 disposed adjacent to the silver-solder reaction zone 18. In these embodiments, the bismuth-rich solder bulk 16 typically extends at least ⅕ of the thickness of the solder joint 10. Also in these embodiments, the solder joint 10 comprises a plurality of bismuth-rich grains 20 formed from bismuth and substantially dispersed throughout at least the bismuth-rich solder bulk 16 with each of the bismuth-rich grains 20 typically having a dimension of no greater than ¼ of the thickness of the solder joint 10. The window pane 26 further comprises the electrical connector 14 disposed on the solder joint 10 with the electrical connector 14 operatively connected to and in electrical communication with the electrical conductor 12 through the solder joint 10. Further in these embodiments, the solder joint 10 may be formed from a first solder composition and a second solder composition. Still further in these embodiments, the solder joint 10 may be formed by the steps of bonding the first solder composition to the electrical conductor 12 to form the first solder layer 30, wherein the first solder composition comprises bismuth in an amount of from 10 to 80 parts by weight based on 100 parts by weight of the first solder composition, bonding the second solder composition to the electrical connector 14 to form the second solder layer 32, wherein the second solder composition comprises tin in an amount of from 95 to 100 parts by weight based on 100 parts by weight of the second solder composition, and bonding the first solder layer 30 and the second solder layer 32 together to form the solder joint 10.

Figure 11:
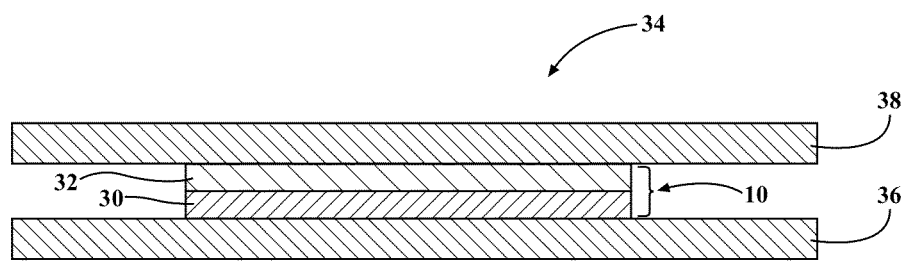
FIG. 11 is a cross-sectional schematic view of one embodiment of an electrical device comprising a first electrical conductor, the solder joint, and a second electrical conductor.

In other embodiments, the solder joint 10 may be used for an electrical device 34 which comprises a first electrical conductor 36, the solder joint 10, and a second electrical conductor 38, as shown in FIG. 11. In embodiments comprising the electrical device 34, the first electrical conductor 36 is the electrical conductor 12, as described above, and the second electrical conductor 38 is the electrical connector 14, as described above. The first electrical conductor 36 comprises silver. The second electrical conductor 38 is disposed on the solder joint 10 with the second electrical conductor 38 operatively connected to and in electrical communication with the first electrical conductor 36 through the solder joint 10. The solder joint 10 may be utilized in electrical devices, such as sensors, transducers, and/or electrical filters, and the like.

It is to be appreciated that many changes can be made to the following examples, while still obtaining like or similar results. Accordingly, the following examples, illustrating embodiments of the solder joint 10 of the present disclosure, are intended to illustrate and not to limit the disclosure.

EXAMPLES

A first solder composition is bonded to an electrical conductor which comprises silver. The first solder composition is cooled to below the solidus temperature of the first solder composition to form a first solder layer which is disposed on the electrical conductor and has a thickness of from $10 \times 10^{-6}$ to $500 \times 10^{-6}$ meters. A second solder composition is bonded to an electrical connector which comprises copper. The second solder composition is cooled to below the solidus temperature of the second solder composition to form a second solder layer which is disposed on the electrical connector and has a thickness of from $10 \times 10^{-6}$ to $500 \times 10^{-6}$ meters. The first and second solder layers are bonded together, and then cooled to below the solidus temperature of the first and second solder layers to form a solder joint which is disposed between the electrical conductor and the electrical connector. Table I below illustrates formulas for the first solder composition (first solder compositions I and II) and the second solder composition.

A solder joint (Example Solder Joint), formed from the first solder composition I and the second solder composition, is evaluated against test specifications according to SAE USCAR40, AK2.1, and internal tests. Table II below illustrates results for the evaluation of the Example Solder Joint. A microstructure of the Example Solder Joint I is shown in FIG. 3.

A microstructure for a solder joint (Example Solder Joint II), formed from the first solder composition II and the second solder composition, is shown in FIG. 4.

TABLE I

| Components | First Solder Composition I | First Solder Composition II | Second Solder Composition |
|---|---|---|---|
| Bismuth (w/w) | 46 | 64 | — |
| Tin (w/w) | 48 | 30 | 96.5 |
| Silver (w/w) | 2 | 2 | 3 |
| Copper (w/w) | 4 | 4 | 0.5 |
| TOTAL | 100 | 100 | 100 |

TABLE II

| Test | Conditions | Duration | Passing Requirements | Results for Example Solder Joint |
|---|---|---|---|---|
| Initial Strength | — | — | 100N Tensile | Pass |
| Thermal Shock | 1000 cycles | 41 days | 50N Tensile | Pass |
| Thermal Cycle | 45 cycles | 7.5 days | 50N Tensile | Pass |
| High Temperature | 120° C. | 1 day | 50N Tensile | Pass |
| High Temperature with 1 kg Load | 105° C. | 21 days | Hold | Pass |
| Heat and Humidity | 80° C. | 21 days | 50N Tensile | Pass |

As shown in Table II, the Example Solder Joint passes test specifications provided according to SAE USCAR40, AK2.1, and internal tests. Improved properties of the solder joint, as evidenced by the passing of the test specifications, are attributed to the microstructure of the solder joint. The bismuth in the first solder composition acts as a reaction modifier to control formation of the silver-tin alloy ($Ag_3Sn$) of the silver-solder reaction zone in solder-conductor interface. During formation of the first solder layer from the first solder composition and the electrical conductor, the silver-tin alloy and the bismuth diffuse into the silver of the electrical conductor to form a bond having increased heat stability between the first solder layer and the electrical conductor.

The second solder composition controls the formation of the copper-tin intermetallic phase comprising the copper-tin alloy ($Cu_6Sn_5$) in the solder-connector interface. During formation of the second solder layer from the second solder composition and the electrical connector, the tin reacts with the copper of the electrical connector to form a bond having increased heat stability between the second solder layer and the electrical connector. The formation of the Example Solder Joint from the first solder layer and the second solder layer produces a microstructure having bismuth-rich solder bulk adjacent to the silver-solder reaction zone that enhances durability and strength of the solder joint.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is also to be understood that any ranges and subranges relied upon in describing various embodiments of the present disclosure independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present disclosure, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims.

In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The present disclosure has been described herein in an illustrative manner, and it is to be understood that the terminology which has been used is intended to be in the nature of words of description rather than of limitation. Many modifications and variations of the present disclosure are possible in light of the above teachings. The present disclosure may be practiced otherwise than as specifically described within the scope of the appended claims. The subject matter of all combinations of independent and dependent claims, both singly and multiply dependent, is herein expressly contemplated.

What is claimed is:

1. A solder joint disposed on an electrical conductor which comprises silver, said solder joint comprising:
   bismuth and tin,
      wherein said solder joint is formed from a first solder composition comprising bismuth and from a second solder composition comprising tin;
   a microstructure comprising a bismuth-rich solder bulk and a silver-solder reaction zone,
      wherein said bismuth-rich solder bulk is disposed adjacent to said silver-solder reaction zone; and
   a plurality of bismuth-rich grains formed from bismuth and substantially dispersed throughout at least said bismuth-rich solder bulk.

2. The solder joint of claim 1 wherein said solder joint and said electrical conductor form a solder-conductor interface therebetween.

3. The solder joint of claim 2 having a thickness of said solder joint extending from said solder-conductor interface to a surface opposite said solder-conductor interface wherein each of said bismuth-rich grains has a dimension of no greater than ¼ of said thickness of said solder joint.

4. The solder joint of claim 3 wherein said bismuth-rich solder bulk extends at least ⅕ of said thickness of said solder joint.

5. The solder joint of claim 2 wherein said solder-conductor interface of said solder joint comprises bismuth and said silver-solder reaction zone with said bismuth disposed throughout said silver-solder reaction zone.

6. The solder joint of claim 1 wherein said microstructure of said solder joint further comprises a tin-rich phase disposed adjacent to said bismuth-rich solder bulk and opposite said silver-solder reaction zone.

7. The solder joint of claim 1 wherein said first solder composition comprises bismuth in an amount of from 10 to 80 parts by weight based on 100 parts by weight of said first solder composition.

8. The solder joint of claim 1 wherein said first solder composition further comprises tin.

9. The solder joint of claim 8 wherein said first solder composition comprises tin in an amount of from 20 to 90 parts by weight based on 100 parts by weight of said first solder composition.

10. The solder joint of claim 1 wherein said second solder composition comprises tin in an amount of from 95 to 100 parts by weight based on 100 parts by weight of said second solder composition.

11. The solder joint of claim 1 formed by the steps of:
   bonding said first solder composition to said electrical conductor to form a first solder layer, wherein said first solder composition comprises bismuth in an amount of from 10 to 80 parts by weight based on 100 parts by weight of said first solder composition; and
   bonding said second solder composition to said first solder layer, thereby forming said solder joint, wherein said second solder composition comprises tin in an amount of from 95 to 100 parts by weight based on 100 parts by weight of said second solder composition.

12. The solder joint of claim 1 substantially free of lead.

13. The solder joint of claim 1 substantially free of indium.

14. A window pane comprising:
   a substrate formed from glass;
   an electrical conductor comprising silver and disposed across a region of said substrate;

a solder joint disposed on said electrical conductor and comprising;
bismuth and tin,
wherein said solder joint is formed from a first solder composition comprising bismuth and from a second solder composition comprising tin,
a microstructure comprising a bismuth-rich solder bulk and a silver-solder reaction zone,
wherein said bismuth-rich solder bulk is disposed adjacent to said silver-solder reaction zone, and
a plurality of bismuth-rich grains formed from bismuth and substantially dispersed throughout at least said bismuth-rich solder bulk; and
an electrical connector disposed on said solder joint with said electrical connector operatively connected to and in electrical communication with said electrical conductor through said solder joint.

15. The window pane of claim 14 wherein said solder joint and said electrical conductor form a solder-conductor interface therebetween.

16. The window pane of claim 15 wherein said solder joint and said electrical connector form a solder-connector interface therebetween with a thickness of said solder joint extending from said solder-conductor interface to said solder-connector interface wherein each of said bismuth-rich grains has a dimension of no greater than ¼ of said thickness of said solder joint.

17. The window pane of claim 16 wherein said bismuth-rich solder bulk of said solder joint extends at least ⅕ of said thickness of said solder joint.

18. The window pane of claim 15 wherein said solder-conductor interface of said solder joint comprises bismuth and said silver-solder reaction zone with said bismuth disposed throughout said silver-solder reaction zone.

19. The window pane of claim 14 wherein said microstructure of said solder joint further comprises a tin-rich phase disposed adjacent to said bismuth-rich solder bulk and opposite said silver-solder reaction zone.

20. The window pane of claim 14 wherein said first solder composition of said solder joint comprises bismuth in an amount of from 10 to 80 parts by weight based on 100 parts by weight of said first solder composition.

21. The window pane of claim 14 wherein said first solder composition of said solder joint further comprises tin.

22. The window pane of claim 21 wherein said first solder composition of said solder joint comprises tin in an amount of from 20 to 90 parts by weight based on 100 parts by weight of said first solder composition.

23. The window pane of claim 14 wherein said second solder composition of said solder joint comprises tin in an amount of from 95 to 100 parts by weight based on 100 parts by weight of said second solder composition.

24. The window pane of claim 14 wherein said solder joint is formed by the steps of:
bonding said first solder composition to said electrical conductor to form a first solder layer, wherein said first solder composition comprises bismuth in an amount of from 10 to 80 parts by weight based on 100 parts by weight of said first solder composition;
bonding said second solder composition to said electrical connector to form a second solder layer, wherein said second solder composition comprises tin in an amount of from 95 to 100 parts by weight based on 100 parts by weight of said second solder composition; and
bonding said first solder layer and said second solder layer together to form said solder joint.

25. The window pane of claim 14 wherein said solder joint is substantially free of lead.

26. The window pane of claim 14 wherein said solder joint is substantially free of indium.

27. An electrical device comprising:
a first electrical conductor comprising silver;
a solder joint disposed on said first electrical conductor and comprising;
bismuth and tin,
wherein said solder joint is formed from a first solder composition comprising bismuth and from a second solder composition comprising tin,
a microstructure comprising a bismuth-rich solder bulk and a silver-solder reaction zone,
wherein said bismuth-rich solder bulk is disposed adjacent to said silver-solder reaction zone, and
a plurality of bismuth-rich grains formed from bismuth and substantially dispersed throughout at least said bismuth-rich solder bulk; and
a second electrical conductor disposed on said solder joint with said second electrical conductor operatively connected to and in electrical communication with said first electrical conductor through said solder joint.

28. The electrical device of claim 27 wherein said solder joint is formed by the steps of:
bonding said first solder composition to said first electrical conductor to form a first solder layer, wherein said first solder composition comprises bismuth in an amount of from 10 to 80 parts by weight based on 100 parts by weight of said first solder composition;
bonding said second solder composition to said first solder layer to form a second solder layer, wherein said second solder composition comprises tin in an amount of from 95 to 100 parts by weight based on 100 parts by weight of said second solder composition; and
bonding said second electrical conductor to said second solder layer to form said solder joint.

29. The electrical device of claim 27 wherein said solder joint is formed by the steps of:
bonding said first solder composition to said first electrical conductor to form a first solder layer, wherein said first solder composition comprises bismuth in an amount of from 10 to 80 parts by weight based on 100 parts by weight of said first solder composition;
bonding said second solder composition to said second electrical conductor to form a second solder layer, wherein said second solder composition comprises tin in an amount of from 95 to 100 parts by weight based on 100 parts by weight of said second solder composition; and
bonding said first solder layer and said second solder layer together to form said solder joint.

30. The electrical conductor of claim 27 wherein:
said first solder composition comprises bismuth in an amount of from 10 to 80 parts by weight based on 100 parts by weight and tin in an amount of from 20 to 90 parts by weight, each based on 100 parts by weight of said first solder composition; and
said second solder composition comprises tin in an amount of from 95 to 100 parts by weight based on 100 parts by weight of said second solder composition.

* * * * *